United States Patent
Pearson et al.

(10) Patent No.: US 7,683,524 B2
(45) Date of Patent: Mar. 23, 2010

(54) MULTICHANNEL, SURFACE PARALLEL, ZONAL TRANSDUCER SYSTEM

(75) Inventors: David D. Pearson, Hudson, MA (US); Jeffrey L. Cavaco, Boylston, MA (US); Jacqueline Roche, Huntsville, AL (US)

(73) Assignee: Xinetics, Inc., Devens, MA (US)

( * ) Notice: Subject to any disclaimer, the term of this patent is extended or adjusted under 35 U.S.C. 154(b) by 809 days.

(21) Appl. No.: 11/215,981

(22) Filed: Aug. 31, 2005

(65) Prior Publication Data

US 2007/0046108 A1  Mar. 1, 2007

(51) Int. Cl.
*H01L 41/08* (2006.01)
(52) U.S. Cl. ............................ 310/328; 310/113
(58) Field of Classification Search ................ 310/328, 310/26, 311, 352, 351, 369, 367; 359/291, 359/295, 849, 848, 196; H01L 41/08
See application file for complete search history.

(56) References Cited

U.S. PATENT DOCUMENTS

| | | | |
|---|---|---|---|
| 3,904,274 A | | 9/1975 | Feinleib et al. |
| 5,076,700 A | * | 12/1991 | DeCaprio .................... 359/848 |
| 5,781,355 A | * | 7/1998 | Meier .......................... 359/848 |
| 6,947,201 B2 | * | 9/2005 | Ealey .......................... 359/295 |
| 7,192,145 B2 | * | 3/2007 | Ealey .......................... 359/849 |

OTHER PUBLICATIONS

U.S. Appl. No. 10/730,412, filed Dec. 8, 2003, Mark A. Ealey.

* cited by examiner

*Primary Examiner*—Walter Benson
*Assistant Examiner*—Karen B Addison
(74) *Attorney, Agent, or Firm*—Iandiorio Teska & Coleman

(57) ABSTRACT

A multichannel, surface parallel, zonal transducer system includes a membrane and a compound transducer mounted on the membrane, the compound transducer including a plurality of transducer elements extending generally parallel to the membrane, interconnected in a closed network and individually addressable.

29 Claims, 7 Drawing Sheets

MULTICHANNEL, SURFACE PARALLEL, ZONAL TRANSDUCER SYSTEM

FIELD OF THE INVENTION

This invention relates to a multichannel, surface parallel, zonal transducer system, and more particularly to such a transducer system useful in adaptive optic systems.

BACKGROUND OF THE INVENTION

Multichannel, surface parallel, zonal transducer systems are often used for controlling light weight adaptive optics. In one approach a MEMS device consisting of individual actuators of piezoelectric, ferroelectric or capacitive material are mounted on one side of an optical membrane. Optical coatings are often applied to the optical surface on the other side of the membrane. This approach suffers from a number of shortcomings. The mass of the actuators themselves suspended from the membrane distort the membrane. And the coatings can cause further stress and deformation. The amount of motion is limited, usually no more than 1½-2 um, and often is not sufficient to compensate for even these inherent deformations let alone other environmentally caused deformations. In addition these devices are made by building up a number of their layers on the membrane. Each application of a layer thermally cycles the membrane and actuators inducing stresses. And these actuators are ultimately not more than 15 um thick and therefore not capable of applying very much force. Typically the largest optical element that can be made this way is about 10 mm and they require high voltage drives, e.g. 300V.

In another approach using a substrate support the actuators are mounted spaced from the membrane or optical surface of the substrate and oriented generally parallel to the optical surface or membrane U.S. patent application Ser. No. 10/730,412, filed Dec. 8, 2003, entitled Integrated Zonal Meniscus Mirror, by Mark A. Ealey herein incorporated in its entirety by this reference. This approach requires discrete actuators and a support substrate. The stiffness of the substrate limits the amount of motion that can be applied to the substrate to shape or adapt the optical surface.

BRIEF SUMMARY OF THE INVENTION

It is therefore an object of this invention to provide an improved multichannel, surface parallel, zonal, transducer system.

It is a further object of this invention to provide such an improved multichannel, surface parallel, zonal, transducer system applicable as an actuator or a sensor.

It is a further object of this invention to provide such an improved multichannel, surface parallel, zonal, transducer system applicable for driving an adaptive optical component such as a mirror.

It is a further object of this invention to provide such an improved multichannel, surface parallel, zonal, transducer system which when applied to drive an adaptive optic component has more stroke, even with thick coatings, higher correction frequency, a wider range of spatial frequency response, with more stiffness and stability and requiring lower drive voltage relative to MEMS type devices.

It is a further object of this invention to provide such an improved multichannel, surface parallel, zonal, transducer system which when applied to drive an adaptive optic component has lower cost and weight, higher spatial frequency and better correction for both low and high spatial frequency deformation.

The invention results from the realization that an improved multichannel, surface parallel, zonal, transducer system useful as an actuator or sensor system or driving adaptive optics can be achieved with a membrane and a compound transducer system mounted on said membrane, the compound transducer including a plurality of transducer elements extending generally parallel to the membrane interconnected in a closed network and individually addressable.

The subject invention, however, in other embodiments, need not achieve all these objectives and the claims hereof should not be limited to structures or methods capable of achieving these objectives.

This invention features a multichannel, surface parallel, zonal transducer system including a membrane and a compound transducer mounted on the membrane. The compound transducer includes a plurality of transducer elements extending generally parallel to the membrane and interconnected in a closed network and individually addressable.

In a preferred embodiment the transducer elements may include at least one ferroic electrodisplacive layer and a common electrode and a set of addressable electrodes associated with each layer. The compound transducer may be monolithic; it may include a connection element interconnecting the transducer elements at each interconnection of two or more transducer elements. The transducer elements may be co-fired. The membrane may be continuous; it may include an optical surface. The transducer elements may include actuators. They may include sensors. The closed network may include a regular pattern of the transducer elements. The compound transducer may be bonded to the membrane. The electrodes may extend along the $d_{31}$ axis of the ferroic electrodisplacive layer. They may extend along the $d_{33}$ axis of the ferroic electrodisplacive layer. The ferroic electrodisplacive layer may include an electrostrictive material, a magnetostrictive material, a piezoelectric material.

The invention also features a multichannel, surface parallel, zonal adaptive optic system including a membrane having an optical surface on one side and a compound actuator mounted on the other side of the membrane. The compound actuator includes a plurality of actuator elements extending generally parallel to the membrane, interconnected in a closed network, and individually addressable.

In a preferred embodiment the actuator elements may include at least one ferroic electrodisplacive layer and a common electrode and a set of addressable electrodes associated with each layer. The actuator elements may be monolithic; there may be a connection element interconnecting the actuator elements at each interconnection of two or more actuator elements. The actuator elements may be co-fired. The membrane may be continuous. The closed network may include a regular pattern of actuator elements. The compound actuator may be bonded to the membrane. The electrodes may extend along the $d_{31}$ axis or along the $d_{33}$ axis of the ferroic electrodisplacive layer. The ferroic electrodisplacive layer may include electrostrictive material, magnetostrictive material, or piezoelectric material.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
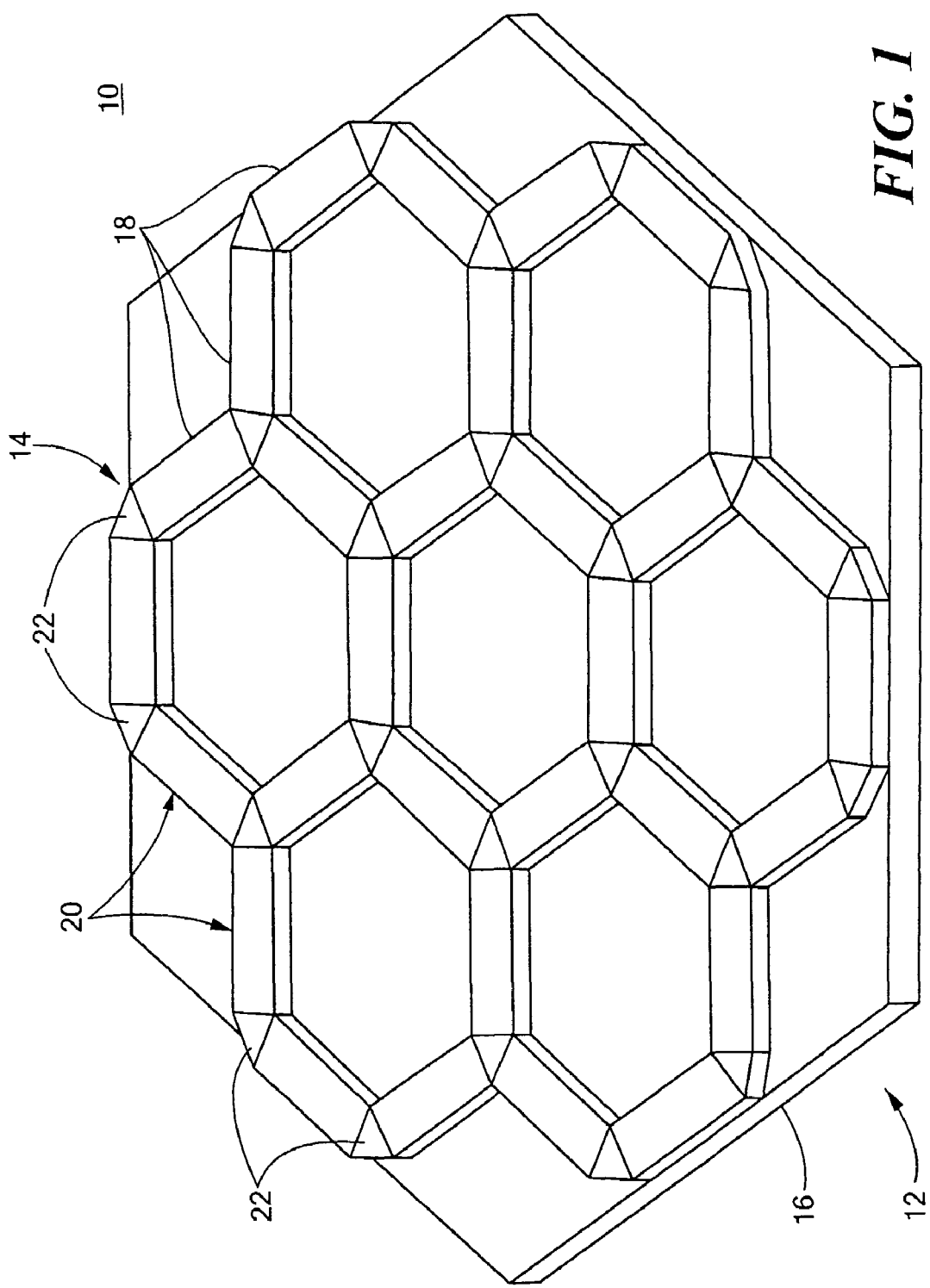
FIG. 1 is a schematic, three dimensional view of a multichannel, surface parallel, zonal transducer system according to this invention showing the transducer elements in a closed network of a regular pattern of hexagonal arrays.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a multichannel, surface parallel, zonal transducer system 10 according to this invention including a membrane 12 and a compound transducer 14 mounted on the membrane. The transducer may be an actuator or a sensor and can have any number of applications. For example, as an acoustic or audio transmitter or receiver, speaker or microphone, membrane 12 may be made of titanium. For an adaptive optic membrane 12 may be made of glass, silicon, silicon carbide, and have an optical surface or finish 16 on the side opposite the compound transducer 14. Compound transducer 14 includes a plurality of transducer elements 18 which extend generally parallel to membrane 12 and are interconnected in a closed network as shown in an array of hexagonal rings. The transducer elements are made of at least one ferroic electrodisplacive layer, with a common electrode and a set of addressable signal electrodes associated with each layer. By ferroic material is meant a ferroelectric material or a ferromagnetic material. For example, a ferroelectric material may be lead magnesium niobate, PMN, a ceramic material which exhibits electrostrictive characteristics. It may also be piezoelectric material or magnetostrictive material. Compound transducer 14 may be mounted by bonding to membrane 12 such as by a structural epoxy or by a conductive structural epoxy for those applications in which a general structural return ground of the zonal transducer is both feasible and desirable. With transducer elements 18 configured as actuator elements, membrane 12 having an optical surface 16, the thirty actuator, 15 centimeter configuration of system 10 using a one millimeter silicon carbide membrane 12 performs quite well. With all thirty actuators activated to 150 ppm, a seven micron focus is obtained. The compound transducer 14 composed of the array of hexagonal rings 20 formed of transducer elements 18 is monolithic and the transducer elements are typically multi-layered or laminar and tape cast with screen printed electrodes and sintered to high density by the co fire process. The compound transducer 14 formed of hexagonal rings 20 made from transducer elements 18 may include connection elements 22 which are disposed at each junction of two or more transducer elements for ease of fabrication. The mounting of the compound transducer on the membrane reinforces and stiffens the membrane sufficiently to provide the rigidity necessary for a practical device. And such features as layered, co-fired and monolithic contribute to this advantage.

Figure 2:
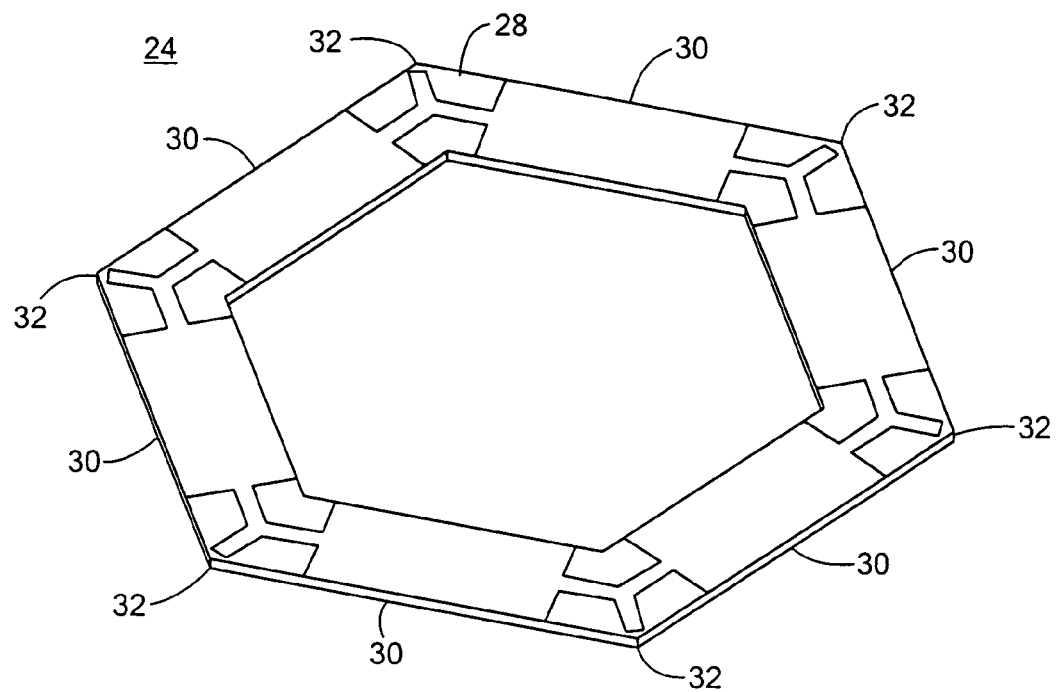
FIG. 2 is a schematic three dimensional view of common electrodes disposed on a ferroelectric layer in a hexagonal array of transducer elements.
Figure 3:
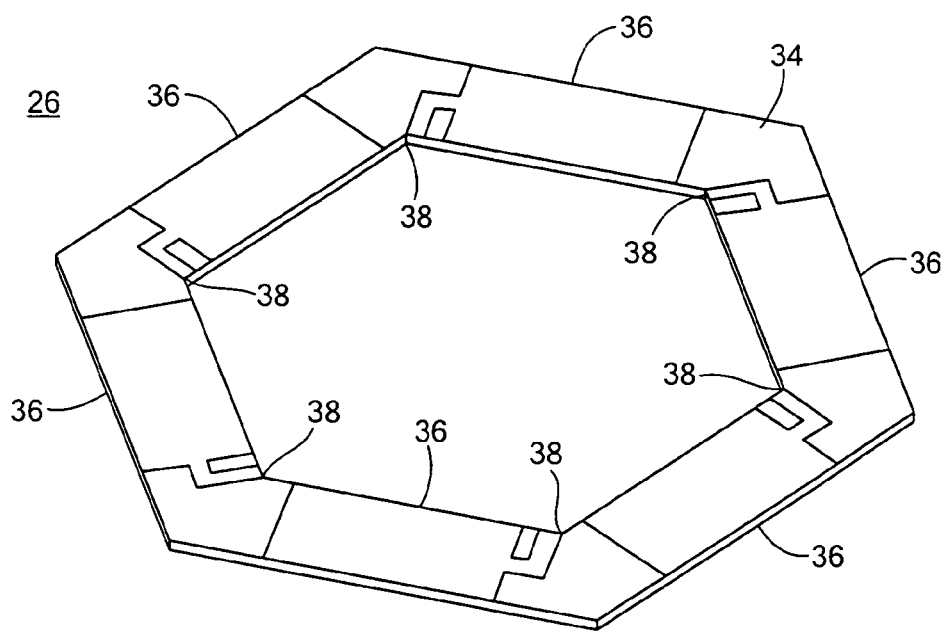
FIG. 3 is a schematic three dimensional view of signal electrodes disposed on a ferroelectric layer in a hexagonal array of transducer elements.
Figure 4:
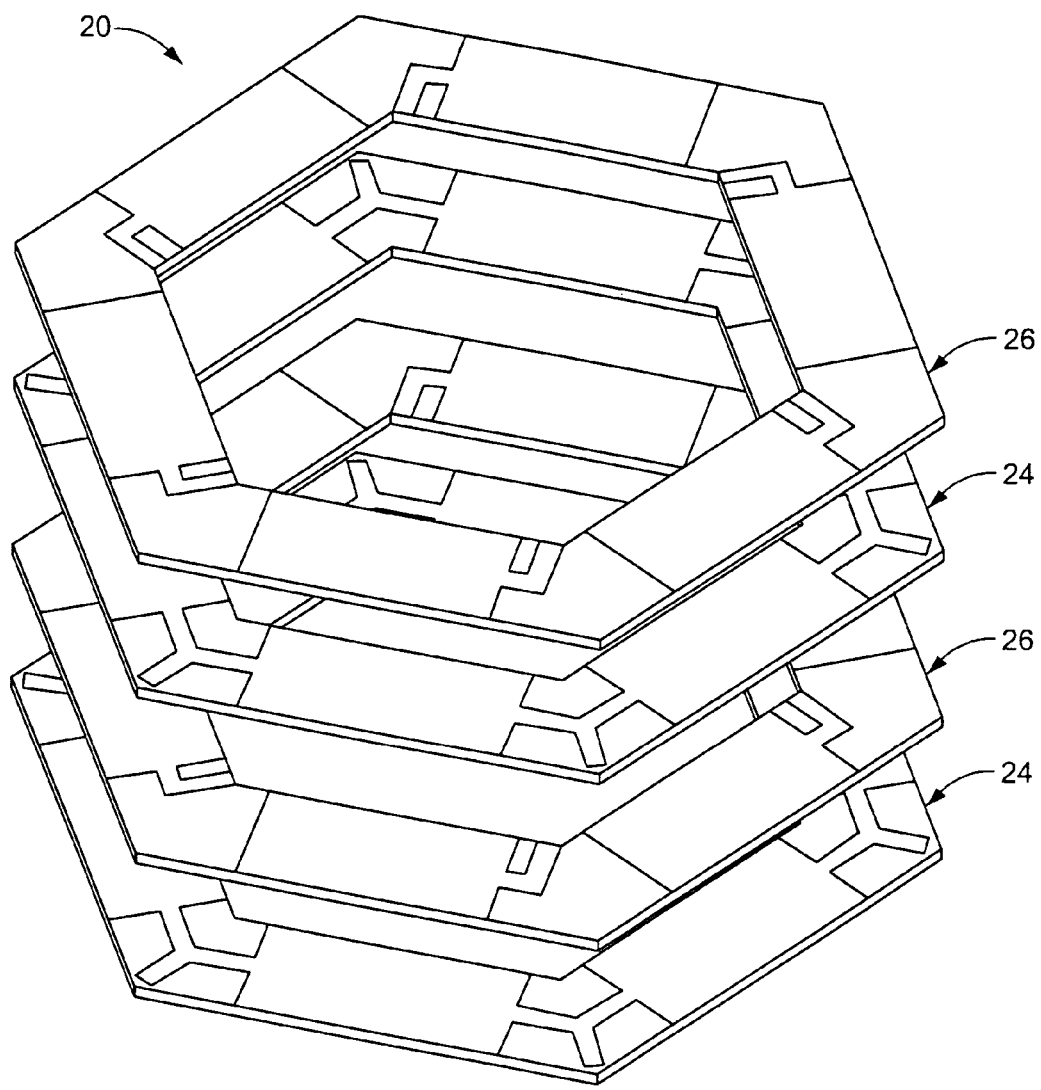
FIG. 4 is a schematic three dimensional exploded view of a stack of common and signal electrode layers of FIGS. 2 and 3.

Compound transducer 14, so called because it is made up of a closed network of transducer elements 18, is constructed in the embodiment as a multi-layer device or laminate as shown in FIGS. 2, 3 and 4. Which illustrate the construction of a single hexagonal ring 20 formed from a stack of common layers 24, FIG. 2, and signal layers 26, FIG. 3. Common layer 24, FIG. 2, includes a ferroelectric layer 28 formed in the shape of a hexagonal ring on which has been deposited conductive material forming a number of common electrodes 30 which are interconnected and brought out to common leads 32 at each apex, where they will be easily externally accessible. Signal layers 26, FIG. 3, each include a ferroelectric layer 34 on which are deposited signal electrodes 36 each of which has one uniquely addressable lead 38 externally accessible. These are stacked in alternating fashion with common layers 24 and signal layers 26 interstitially arranged to form a stack as in FIG. 4, constituting a hexagonal ring 20 of transducer elements 18. All of electrodes 30, FIG. 2, and 36, FIG. 3 aligned in the same leg of the hexagonal ring 20, FIG. 4, constitute a transducer element 18.

Figure 5:
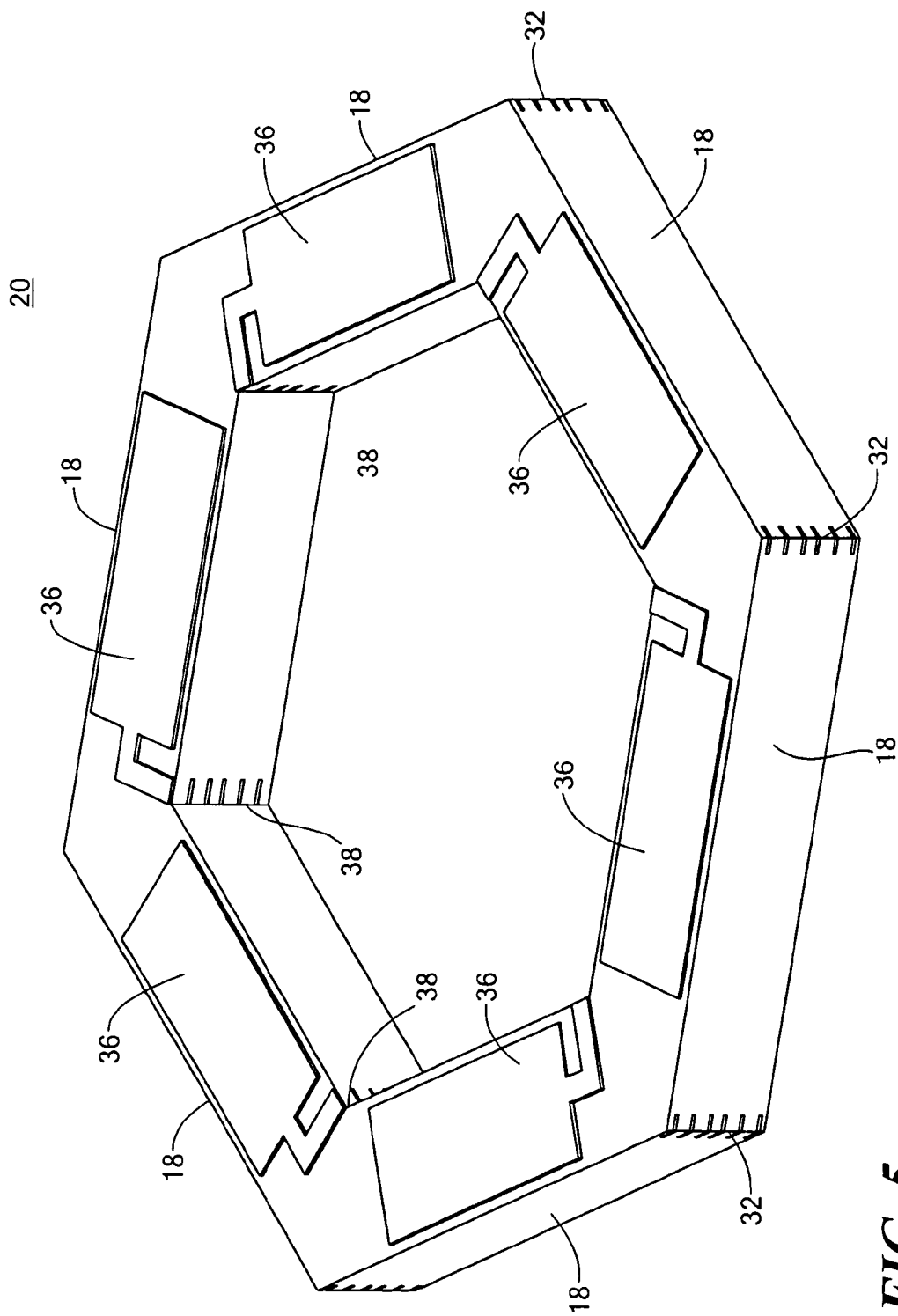
FIG. 5 is a schematic three dimensional view showing the completed stack of FIG. 4 with common and individually addressable signal electrodes.

This results in a completed hexagonal ring 20, FIG. 5, composed of six transducer elements 18 with the common leads 32 accessible at one or more external apices and the individually addressable signal layer leads 38 uniquely addressable on the inner periphery of ring 20. Although this explanation is with respect to a single ring only, this co-fired monolithic laminar structure would actually be made with the entire honeycomb of the rings shown in FIG. 1 at the same time.

Figure 6:
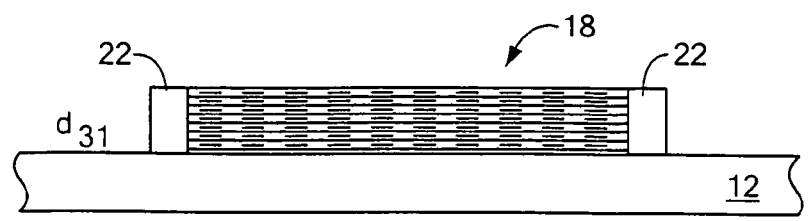
FIG. 6 is a side sectional elevational view of a transducer element of FIGS. 2-5 with the layers and electrodes extending in the $d_{31}$ axis.
Figure 7:
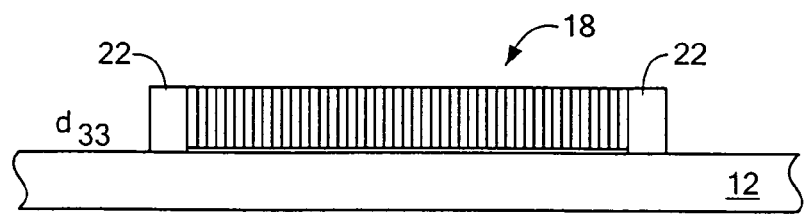
FIG. 7 is a side sectional elevational view of a transducer element of FIGS. 2-5 with the layers and electrodes extending in the $d_{33}$ axis.

The laminar construction of each transducer element 18 is shown in more detail in FIG. 6, where the layers and the electrodes have been aligned along the $d_{31}$ axis. But this is not a limitation of the invention. For example, the layers could be stacked orthogonally to the direction shown in FIG. 6 as shown in FIG. 7, where the operative orientation is the $d_{33}$ axis. The $d_{33}$ orientation provides more force and displacement which would be desirable in some applications. The multilayer laminar construction using layer 24 and 26, FIG. 6, and 24a, 26a, FIG. 7, convey the further advantage of reducing the drive voltage needed. If one layer required 300V, in this arrangement two would require only 150 voltage, ten, 30 volts . . . while providing the same force/displacement.

Figure 8:
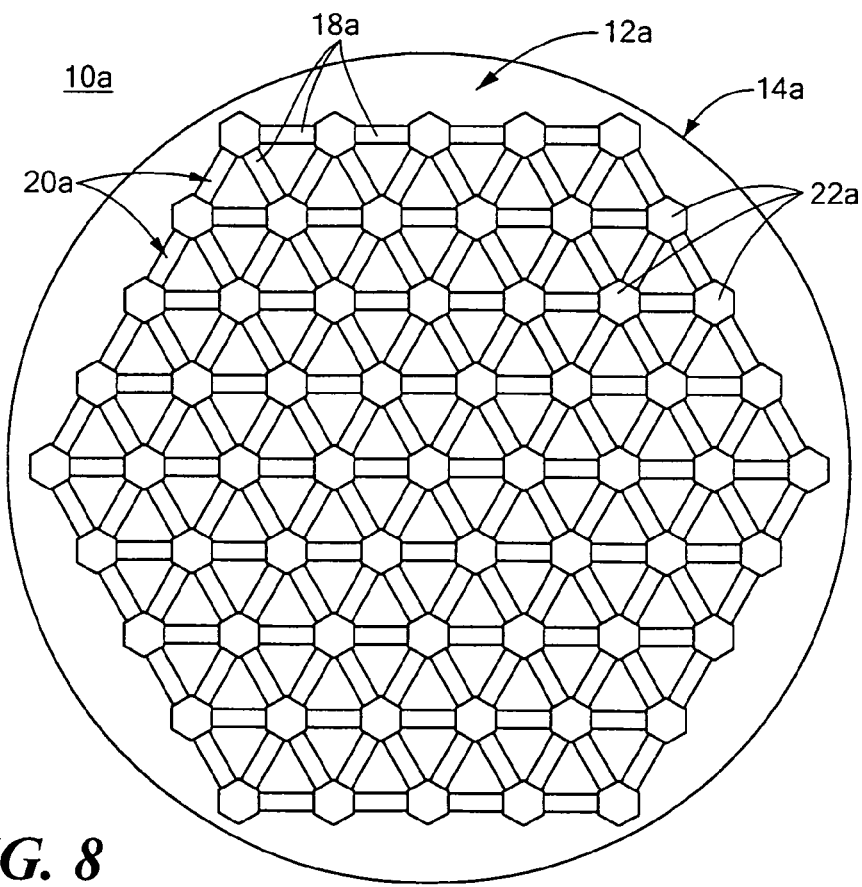
FIG. 8 is a schematic bottom plan view showing transducer elements in a closed network of a regular pattern of triangular arrays.
Figure 9:
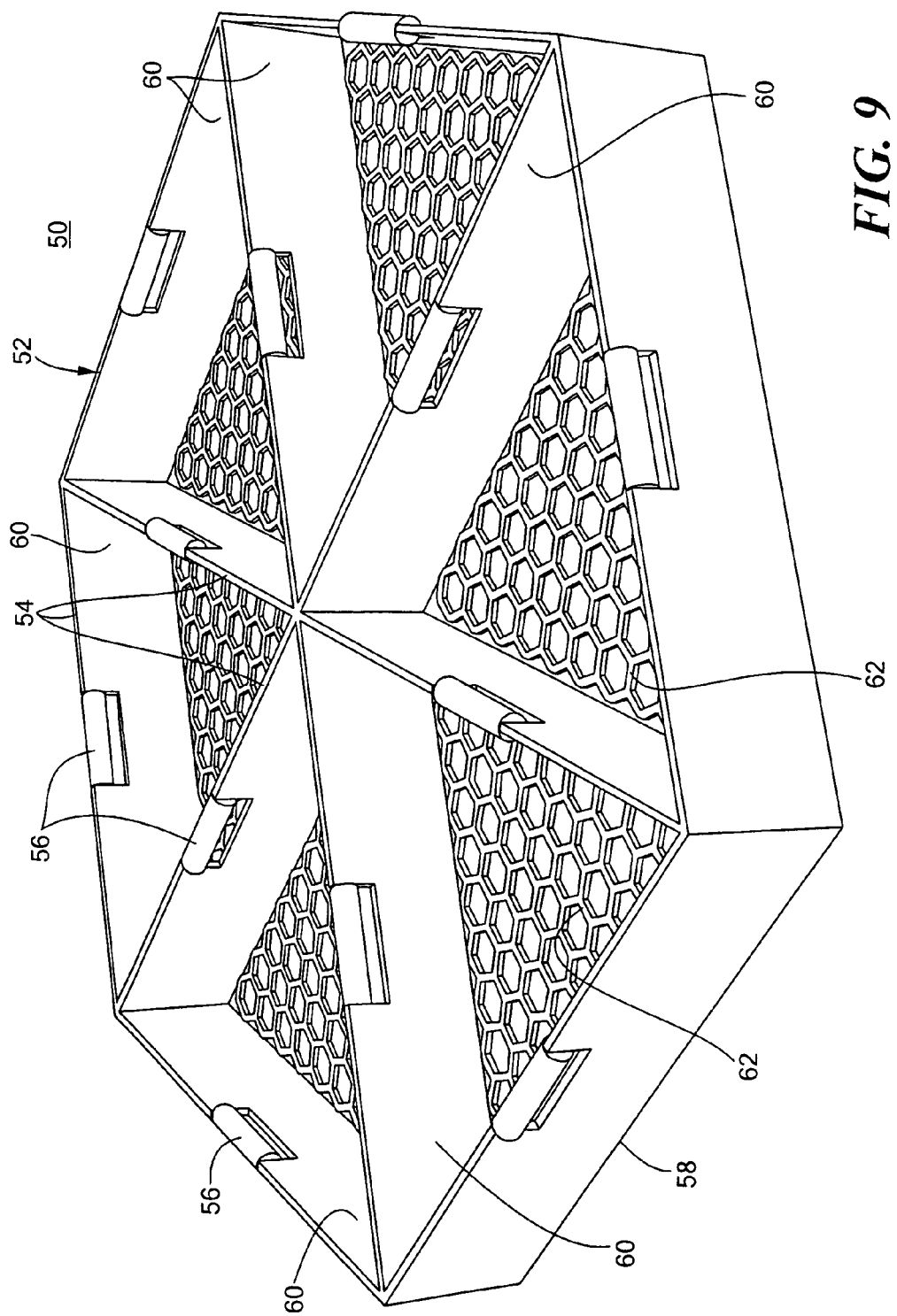
FIG. 9 is a schematic, three dimensional view of an integrated meniscus mirror with discrete surface parallel actuators employing this invention.

Although thus far the honeycomb is shown formed at the hexagonal rings, each formed of six transducer elements, this is not a necessary limitation of the invention as the compound transducer may take any form of pattern or array, irregular or regular. Regular, for example, could be hexagonal as previously shown, or triangular as shown in FIG. 8, or square or any other regular or irregular sub-pattern. In FIG. 8 there is shown the transducer elements 18a formed of triangular shapes 20a. Regardless of the particular configuration the invention uses a closed interconnected net of transducer elements bonded to a membrane so that each transducer element is individually addressable. The full stroke for a 15 centimeter diameter is estimated to be approximately 365 microns, a marked increase over prior art levels. The transducer systems of this invention may be used alone or in conjunction with other systems. For example, there is shown in FIG. 9 an integrated actuator meniscus mirror 50, with substrate 52 having a plurality of ribs 54, each of which includes in it a discrete actuator 56 oriented generally parallel to the membrane or optical surface 58. Inside of each of the triangular bays 60 formed by the ribs 54 is located a transducer system according to this invention in the form of a compound transducer 62 in the form of a honeycomb or array of hexagonal rings. These compound transducers 62 may be bonded to the membrane as explained previously and may have all the characteristics as explained above, that is, they are formed from a plurality of transducer elements extending generally parallel to the membrane or optical surface and interconnected in a closed network and are individually addressable.

Figure 10:
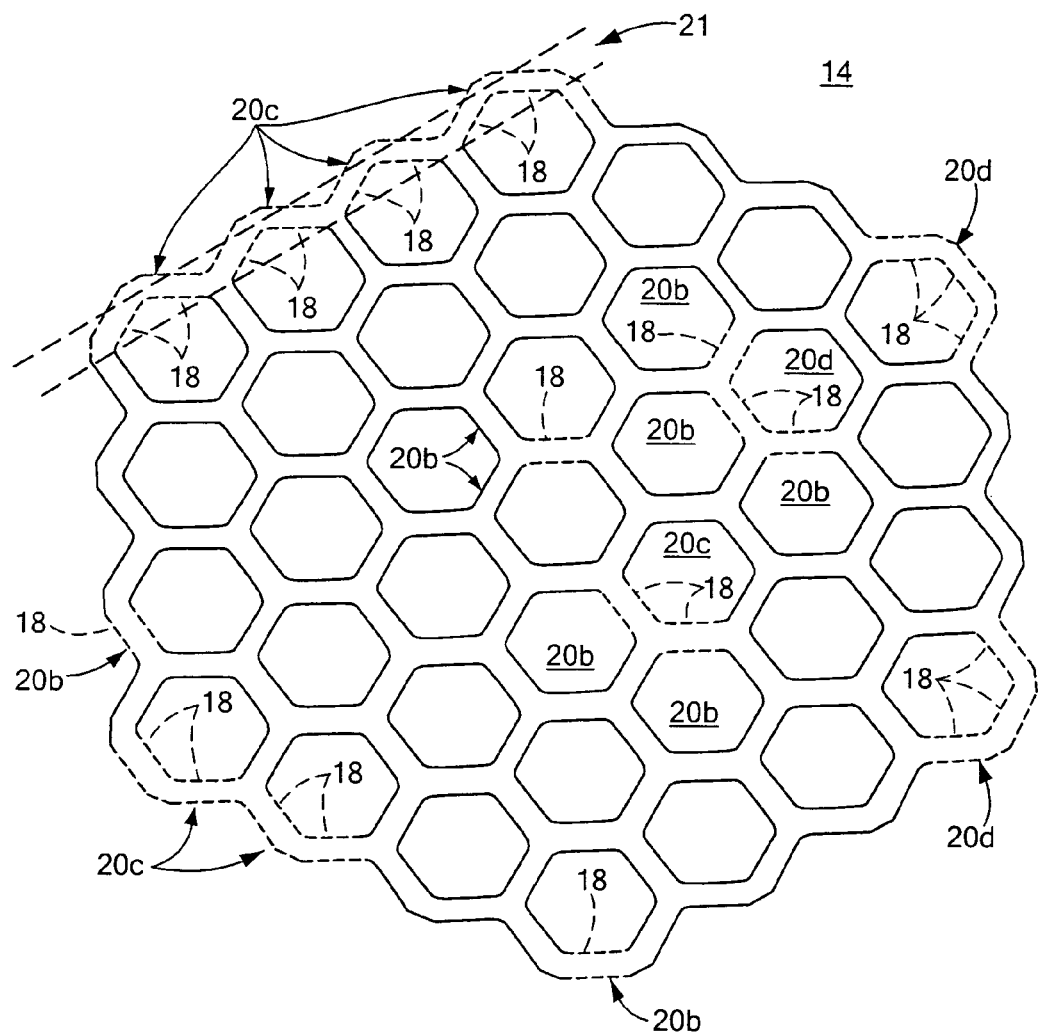
FIG. 10 is a schematic plan view of compound transducer with transducer elements in a closed network with some transducer elements omitted.

The embodiments herein thus far depict compound transducer 14 in a closed network where every ring 20 of transducer elements 18 is a complete ring of transducer elements. But this is not a necessary limitation of the invention. The compound transducer 14 is still considered a closed network if some of the array is closed even if some is open. For example, compound transducer 14b, FIG. 10, is a closed network even though some of the rings 20 are missing one, 20b, two 20c or more 20d transducer elements 18 whether the transducer elements 18 are missing from central rings or the peripheral rings. Open ring segments e.g. 20c may be useful in certain cases where there is a structural obstruction such as a wall 21 or other surface feature and the open segment would react against the wall or obstruction instead of an adjacent active segment.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A multichannel, surface parallel, zonal transducer system comprising:
    a membrane; and
    a compound transducer mounted on the membrane to reinforce and stiffen the membrane, said compound transducer including a plurality of transducer elements extending generally parallel to the membrane, interconnected in a closed network and individually addressable.

2. The multichannel, surface parallel, zonal transducer system of claim 1 in which said transducer elements include at least one ferroic electrodisplacive layer and a common electrode and a set of addressable electrodes associated with each layer.

3. The multichannel, surface parallel, zonal transducer system of claim 1 in which said compound transducer is monolithic.

4. The multichannel, surface parallel, zonal transducer system of claim 1 in which said compound transducer includes a connection element interconnecting said transducer elements at each interconnection of two or more transducer elements.

5. The multichannel, surface parallel, zonal transducer system of claim 1 in which said transducer elements are co-fired.

6. The multichannel, surface parallel, zonal transducer system of claim 1 in which said membrane is continuous.

7. The multichannel, surface parallel, zonal transducer system of claim 1 in which said membrane includes an optical surface.

8. The multichannel, surface parallel, zonal transducer system of claim 1 in which said transducer elements include actuators.

9. The multichannel, surface parallel, zonal transducer system of claim 1 in which said transducer elements include sensors.

10. The multichannel, surface parallel, zonal transducer system of claim 1 in which said closed network includes a regular pattern of said transducer elements.

11. The multichannel, surface parallel, zonal transducer system of claim 1 in which said compound transducer is bonded to said membrane.

12. The multichannel, surface parallel, zonal transducer system of claim 2 in which said electrodes extend along the $d_{31}$ axis of said ferroic electrodisplacive layer.

13. The multichannel; surface parallel, zonal transducer system of claim 2 in which said electrodes extend along the $d_{33}$ axis of said ferroic electrodisplacive layer.

14. The multichannel, surface parallel, zonal transducer system of claim 2 in which said ferroic electrodisplacive layer includes an electrostrictive material.

15. The multichannel, surface parallel, zonal transducer system of claim 2 in which said ferroic electrodisplacive layer includes an magnetostrictive material.

16. The multichannel, surface parallel, zonal transducer system of claim 2 in which said ferroic electrodisplacive layer includes an piezoelectric material.

17. A multichannel, surface parallel, zonal adaptive optic system comprising:
    a membrane having an optical surface on one side; and
    a compound actuator mounted on the other side of said membrane to reinforce and stiffen the membrane, said compound actuator including a plurality of actuator elements, extending generally parallel to the membrane, interconnected in a closed network and individually addressable.

18. The multichannel, surface parallel, zonal adaptive optic system of claim 17 in which said actuator elements include at least one ferroic electrodisplacive layer, a common electrode and a set of addressable electrodes associated with each layer.

19. The multichannel, surface parallel, zonal adaptive optic system of claim 17 in which said compound actuator is monolithic.

20. The multichannel, surface parallel, zonal adaptive optic system of claim 17 in which said compound actuator includes a connection element interconnecting said actuator elements at each interconnection of two or more actuator elements.

21. The multichannel, surface parallel, zonal adaptive optic system of claim 17 in which said actuator elements are co-fired.

22. The multichannel, surface parallel, zonal adaptive optic system of claim 17 in which said membrane is continuous.

23. The multichannel, surface parallel, zonal adaptive optic system of claim 17 in which said closed network includes a regular pattern of said actuator elements.

24. The multichannel, surface parallel, zonal adaptive optic system of claim 17 in which said compound actuator is bonded to said membrane.

25. The multichannel, surface parallel, zonal adaptive optic system of claim 18 in which said electrodes extend along the $d_{31}$ axis of said ferroic electrodisplacive layer.

26. The multichannel, surface-parallel, zonal adaptive optic system of claim 18 in which said electrodes extend along the $d_{33}$ axis of said ferroic electrodisplacive layer.

27. The multichannel, surface parallel, zonal adaptive optic system of claim 18 in which said ferroic electrodisplacive layer includes an electrostrictive material.

28. The multichannel, surface parallel, zonal adaptive optic system of claim 18 in which said ferroic electrodisplacive layer includes an magnetostrictive material.

29. The multichannel, surface parallel, zonal adaptive optic system of claim 18 in which said ferroic electrodisplacive layer includes an piezoelectric material.

* * * * *